(12) United States Patent
Annema

(10) Patent No.: US 6,380,761 B1
(45) Date of Patent: Apr. 30, 2002

(54) LEVEL CONVERTER PROVIDED WITH SLEW-RATE CONTROLLING MEANS

(75) Inventor: Anne Johan Annema, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/744,554

(22) PCT Filed: May 19, 2000

(86) PCT No.: PCT/EP00/04626

§ 371 Date: Jan. 26, 2001

§ 102(e) Date: Jan. 26, 2001

(87) PCT Pub. No.: WO00/74239

PCT Pub. Date: Dec. 7, 2000

(30) Foreign Application Priority Data

May 28, 1999 (EP) .............................. 99201681
Aug. 6, 1999 (EP) .............................. 99202595

(51) Int. Cl.[7] .................. H03K 19/0175; H03K 19/094
(52) U.S. Cl. .......................................... 326/68; 326/70
(58) Field of Search .............................. 326/68, 70, 71, 326/83, 86

(56) References Cited

U.S. PATENT DOCUMENTS 4,587,447 A * 5/1986 Baehring ..................... 326/68

FOREIGN PATENT DOCUMENTS

JP          359012628 A  *  1/1984  .................. 326/17

* cited by examiner

*Primary Examiner*—Michael Tokar
*Assistant Examiner*—Daniel D. Chang
(74) *Attorney, Agent, or Firm*—Aaron Waxler

(57) ABSTRACT

A level converter for the converting of a first digital signal ($U_1$) having a first voltage range into a second digital signal ($U_2$) having a second voltage range comprising an amplifier ($T_0$) having an input for receiving the first digital signal ($U_1$) and an output for supplying the second digital signal ($U_2$), a series arrangement for controlling the slew-rate of the second digital signal ($U_2$) which comprises at least a first capacitor ($C_1$) and a second capacitor ($C_2$) and which is coupled between the output and the input of the amplifier ($T_0$), and voltage controlling means for controlling the voltages ($V_{C1}$, $V_{C2}$) across the at least first and second capacitors ($C_1$, $C_2$). The voltage controlling means comprises at least one voltage source ($V_{Is1}$, $V_{Is2}$) for supplying a separate bias voltage to each internal node ($N_1$, $N_2$) of the series arrangement. The value of the separate bias voltage or the values of the separate bias voltages is/are dependent on the values of the first ($U_1$) and the second ($U_2$) digital signals.

6 Claims, 4 Drawing Sheets

LEVEL CONVERTER PROVIDED WITH SLEW-RATE CONTROLLING MEANS

The invention relates to a level converter for the converting of a first digital signal having a first voltage range into a second digital signal having a second voltage range comprising an amplifier having an input for receiving the first digital signal and an output for supplying the second digital signal, a series arrangement for controlling the slew-rate of the second digital signal which comprises at least a first capacitor and a second capacitor and which is coupled between the output and the input of the amplifier, and voltage controlling means for controlling the voltages across the at least first and second capacitors.

Such a level converter is known from the general state of the art as shown in FIG. 1. It must be stated that where the wordings "level of a signal" is used, the word "level" has to be interpreted as the maximum possible voltage value of the signal minus the minimum possible voltage value of the signal. (The minimum possible voltage level is usual close to zero volt.) The known level converter comprises a field effect transistor $T_0$ having a gate for receiving a first digital signal $U_1$, a source connected to a supply reference terminal GND and a drain connected to an output terminal 2 for delivering a second digital signal $U_2$. The output terminal 2 is connected, via a load $Z_L$, to a supply voltage supplied by a supply voltage source $SPL_{LV}$ of the level converter. The load $Z_L$ may also be replaced by various kinds of circuitries for example by a current source. A series arrangement of a first and a second capacitor $C_1$, $C_2$ is connected between the drain and the gate of the field effect transistor $T_0$. The first and the second capacitors $C_1$, $C_2$ are respectively shunted by a first and a second shunt resistor $R_1$, $R_2$. The known level converter further comprises a pré-drive circuit PDC having a first supply reference connected to the supply reference terminal GND, a second supply reference connected, via a series resistor $R_{PDC}$, to a pré-drive supply voltage source $SPL_{PDC}$, an input coupled to an input terminal 1 of the level converter, and an output coupled to the gate of the field effect transistor $T_0$.

The principle operation of the known level converter is as follows. The input 1 is connected to any digital circuit which supplies a digital signal of which the voltage level must be adapted, normally to a higher voltage level. This digital signal is buffered by the pré-drive circuit PDC which delivers a first digital signal $U_1$, of the level converter. The level of the first digital signal $U_1$ is determined by the value of the supply voltage supplied by the pré-drive supply voltage source $SPL_{PDC}$. The field effect transistor $T_0$ in conjunction with the load $Z_L$ converts the first digital signal $U_1$ into the second digital signal $U_2$. The level of the second digital signal $U_2$ is determined by the value of the supply voltage supplied by the supply voltage source $SPL_{LV}$ of the level converter.

Many known level converters have the disadvantage that they cause electromagnetic interference and/or ground-bounce in other digital circuits, if applied in an integrated circuit. This has been solved in a way as in the known level converter as shown in FIG. 1. In fact two measures are normally implemented. The first measure is the application of the series resistor $R_{PDC}$ for limiting the current which can be supplied by the output of the pré-drive circuit PDC. The second measure is the application of a capacitive path connected between the drain and the gate of the field effect transistor $T_0$. By so doing the slew-rate of the second digital signal $U_2$ is controlled and is approximately equal to the quotient of the value of the limited current and the value of the capacitance formed by the capacitive path. The application of the series resistor $R_{PDC}$ is optional because the current is also limited by the pré-drive circuit itself. However if the series resistor $R_{PDC}$ is omitted the value of the limited current can generally not be predicted very accurately. The simplest implementation for the capacitive path would be a single capacitor connected between the drain and the gate of the field effect transistor $T_0$. However if applied in an integrated circuit this can lead to the problem that the voltage across the single capacitor is higher than permitted. In the known level converter as shown in FIG. 1 this problem is solved by forming the capacitive path by a series arrangement of a first and a second capacitor $C_1$, $C_2$. Since the common node of the first and the second capacitor may not be a DC-floating node the first and the second capacitor $C_1$, $C_2$ are shunted respectively by the first and the second shunt resistor $R_1$, $R_2$.

A problem of the known level converter is that the shunt resistors $R_1$ and $R_2$ increase the static power dissipation of the level converter.

It is an object of the invention to provide a level converter which has a reduced static power dissipation.

To this end, according to the invention, the level converter of the type defined in the opening paragraph is characterized in that the voltage controlling means comprises at least one voltage source for supplying a separate bias voltage to each internal node of the series arrangement, and in that the value of the separate bias voltage or the values of the separate bias voltages is/are dependent on the values of the first and the second digital signals.

The invention is based on the insight that in the known level converter as shown in FIG. 1 the increase of the static power dissipation is caused by the fact that the first and the second resistors form together a DC-path between the drain and the gate of the field effect transistor $T_0$. In principle this is not necessary. Only the internal node(s) (In FIG. 1 there is only one internal node $N_1$) must be biased because otherwise the/these internal node(s) would be DC-floating nodes. For clarity it is stated that the outer nodes of the series arrangement for controlling the slew-rate of the second digital signal $U_2$ may not be interpreted as internal nodes of said series arrangement.

When the state of the first and second digital signal changes, the voltage on the internal nodes have to be changed as well. In the known level converter this occurs automatically by the fact that the series arrangement of the first and the second resistors form a voltage divider. Since a level converter according to the invention do not have such a voltage divider the voltages on the internal nodes must be adapted in a different way. For this reason the at least one voltage source for supplying the bias voltage to the internal node or for supplying separate bias voltages to each internal node must be made dependent on the values of the first and the second digital signals.

An embodiment of the invention may be characterized in that a bias resistor is arranged in series with at least one of the at least one voltages sources. If the aforementioned dependency of the at least one voltage source is not optimal (which in practice is nearly always the case) then the dynamic power dissipation of the level converter will be increased. This increase of the dynamic power dissipation is reduced by the application of a bias resistor to each internal node of the series arrangement for controlling the slew-rate of the second digital signal $U_2$. The value of the bias resistors can however not be chosen arbitrarily high because a too high value of the bias resistor will cause a too inaccurate control of the voltages of the internal nodes. It may not always be necessary to physically implement the bias resistors because the internal resistances of the voltage source or sources for supplying the bias voltage or voltages to each internal node may well serve as said bias resistors.

A further embodiment of the invention may be characterized in that switching means is/are arranged in series with the at least one voltages sources. By so doing a type of class C biasing of each internal node can be accomplished by a proper functioning of said switches, that is to say that a respective switch is opened (non-conducting) as long as the corresponding internal node to which it is coupled is within a certain voltage. As a consequence no charging or discharging occurs as long as the voltage at the corresponding internal node is within said voltage range. This has the advantage that the dynamic power dissipation of the level converter is reduced even in the case that the (separate) bias voltages delivered by the voltage sources are not so very accurate.

A further embodiment of the invention may be characterized in that the switching means is formed by diodes. By this a very simple implementation for the aforementioned switches is accomplished.

Further advantageous embodiments of the invention are specified in claims 5 and 6.

The invention will be described in more detail with reference to the accompanying drawings, in which.

In these Figures parts or elements having like functions or purposes bear the same reference symbols.

Figure 1:
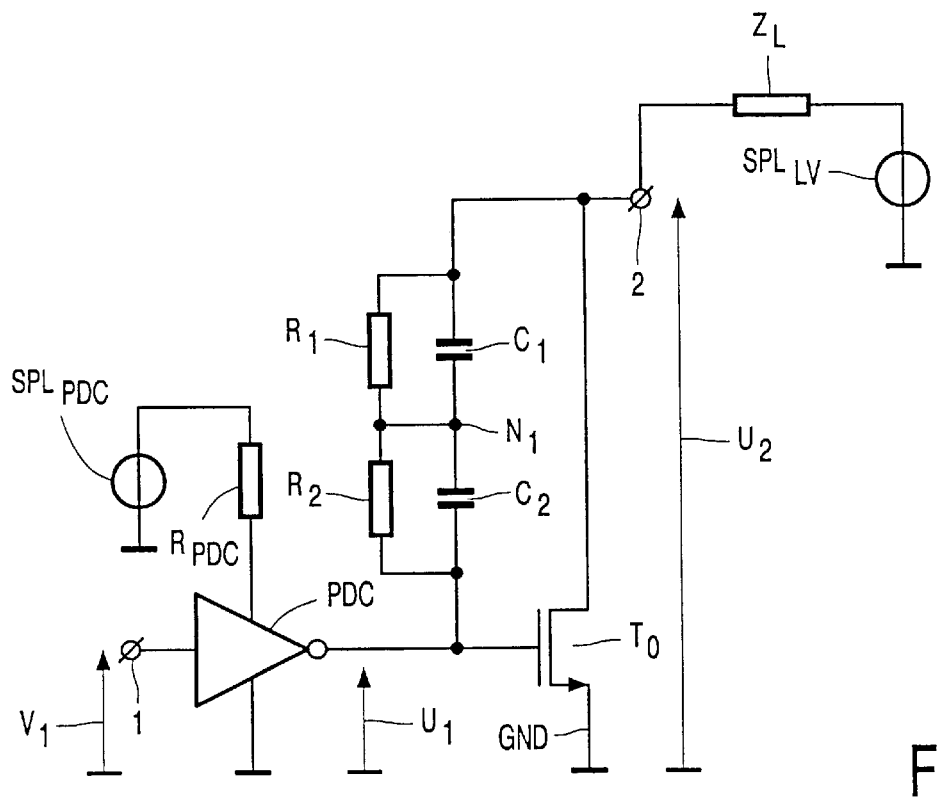
FIG. 1 is a circuit diagram of a known level converter.
Figure 2:
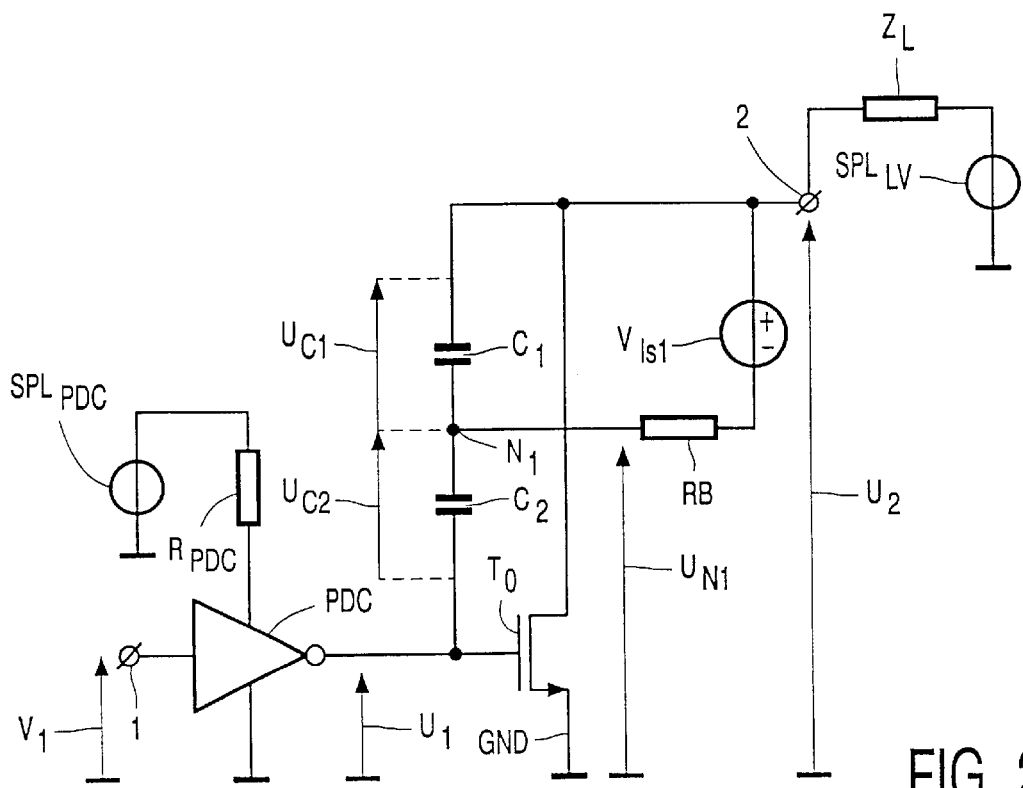
FIG. 2 is a circuit diagram of a first embodiment of a level converter according to the invention.

FIG. 2 shows a circuit diagram of a first embodiment of a level converter according to the invention. The level converter comprises a field effect transistor $T_0$ having a gate for receiving a first digital signal $U_1$, a source connected to a supply reference terminal GND and a drain connected to an output terminal 2 of the level converter for delivering a second digital signal $U_2$. The output terminal 2 is connected, via a load $Z_L$, to a supply voltage supplied by a supply voltage source $SPL_{LV}$ of the level converter. The load $Z_L$ may also be replaced by various kinds of circuitries for example by a current source. A series arrangement of a first and a second capacitor $C_1$, $C_2$ is connected between the drain and the gate of the field effect transistor $T_0$. The level converter further comprises a pré-drive circuit PDC having a first supply reference connected to the supply reference terminal GND, a second supply reference connected, via a series resistor $R_{PDC}$, to a pré-drive supply voltage source $SPL_{PDC}$, an input coupled to an input terminal 1 of the level converter, and an output coupled to the gate of the field effect transistor $T_0$. The level converter further comprises a voltage source $V_{ls1}$ which is connected between the output terminal 2 and, via a bias resistor RB, to the internal node $N_1$ of the series arrangement of the first and the second capacitor $C_1$, $C_2$.

The principle operation of the level converter is as follows. The input 1 is connected to any digital circuit which supplies a digital signal $V_1$ of which the voltage level must be adapted, normally to a higher voltage level. This digital signal $V_1$ is buffered by the pré-drive circuit PDC which delivers a first digital signal $U_1$ of the level converter. The level of the first digital signal $U_1$ is determined by the value of the supply voltage supplied by the pré-drive supply voltage source $SPL_{PDC}$. The field effect transistor $T_0$ in conjunction with the load $Z_L$ converts the first digital signal $U_1$ into the second digital signal $U_2$. The level of the second digital signal $U_2$ is determined by the value of the supply voltage supplied by the supply voltage source $SPL_{LV}$ of the level converter. The series resistor $R_{PDC}$ limits the current which can be supplied by the output of the pré-drive circuit PDC. The slew-rate of the second digital signal $U_2$ is approximately equal to the quotient of the value of the limited current and the value of the capacitance formed by the series arrangement of the first and the second capacitor $C_1$, $C_2$.

Figure 5:
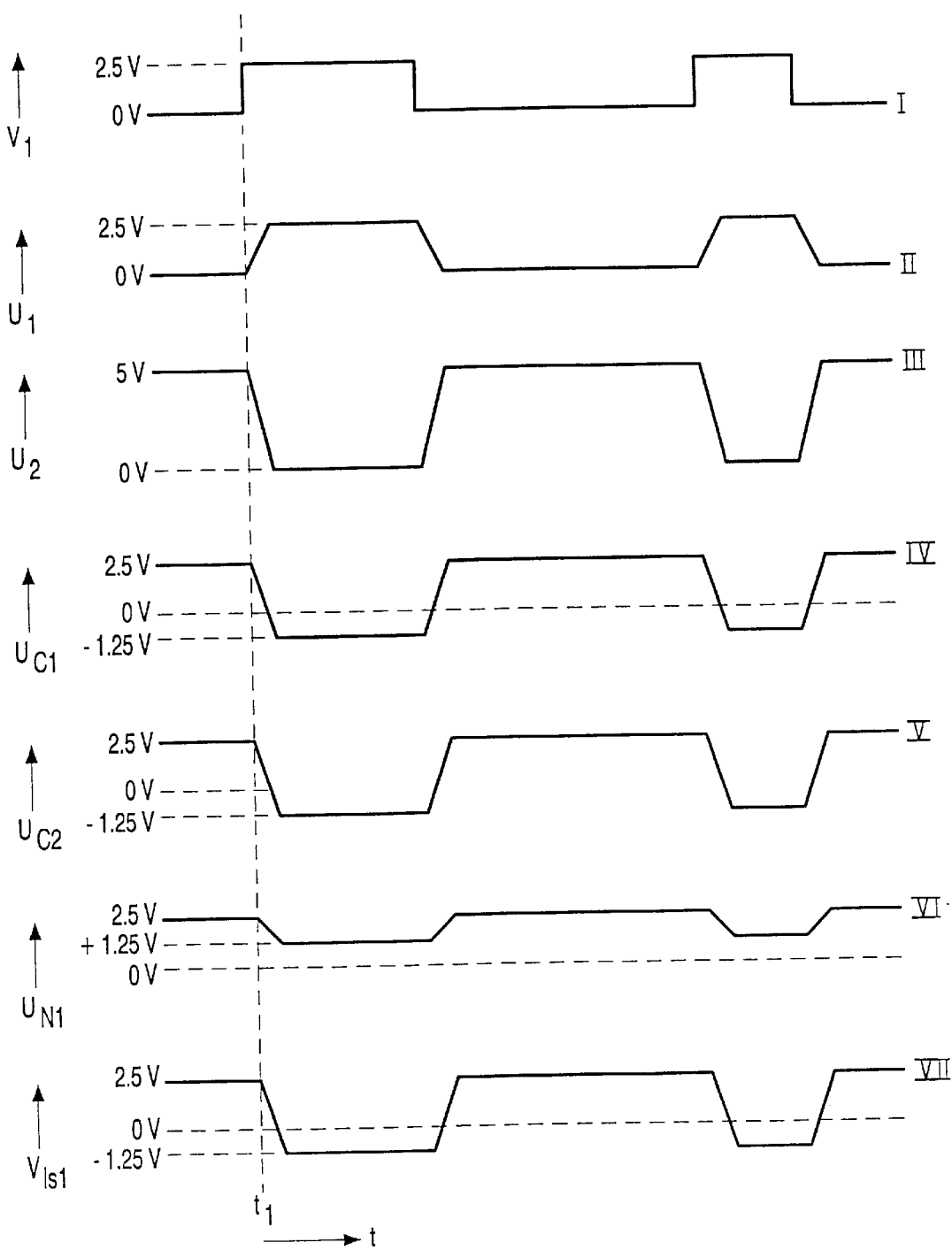
FIG. 5 is a set of signal diagrams I–VII for further explaining the embodiments of FIG. 2.

The operation of the level converter according to FIG. 2 is further explained in conjunction with the signal diagrams I–VII as shown in FIG. 5. As an example it is assumed that the capacitance of the first capacitor $C_1$ is equal to the capacitance of the second capacitor $C_2$. It is further, by way of an example, assumed that the level of the first digital signal $U_1$ equals 2.5 Volt and that the level of the second digital signal $U_2$ equals 5.0 Volt. In this situation the optimal dependency of the bias voltage $V_{ls1}$ is as shown in diagrams II, III, and VII. In order to better explain the operation of the circuit according to FIG. 2 one has first to consider the following theoretical situation: the internal node $N_1$ is a DC-floating node, the first and the second capacitors $C_1$ and $C_2$ are ideal capacitors and are not charged, $V_1$ equals 0 Volt, $U_1$ equals 0 Volt, and $U_2$ equals 5.0 volt. At time $t_1$ $V_1$ changes from 0 Volt to 2.5 Volt. As a consequence $U_1$ changes from 0 Volt to 2.5 Volt and $U_2$ changes from 5.0 Volt to 0 Volt. The voltage $U_{C1}$ across the first capacitor $C_1$, the voltage $U_2$ across the second capacitor $C_2$, and the voltage $U_{N1}$ at the internal node $N_1$ are directly (Kirchhoff's law) determined from the signals $U_1$, and $U_2$, and are as shown in diagrams IV, V, and VI. If now the practical situation is considered that the first and second capacitors $C_1$ and $C_2$ are not ideal and are burdened with parasitic DC-leakage paths, it is clear that the voltages $U_{C1}$, $U_2$, and $U_{N1}$ may deviate from the ideal situation as indicated in the diagrams IV, V, and VI. In order to avoid this problem the internal node $N_1$ is DC-biased by the series arrangement of the bias resistor RB and the voltage source $V_{ls1}$. By so doing the static power dissipation of the level converter is hardly increased since the parasitic DC-leakage paths of the first and the second capacitors are virtually infinite and thus there is no significant DC-path between the drain and the gate of the field effect transistor $T_0$. However in order to avoid a significant increase in dynamic power dissipation the voltage $V_{ls1}$, as indicated in diagram VII, must be about equal to the ideal voltage $U_{C1}$ as indicated in diagram IV because then the (dynamic) current through the bias resistor RB is negligible. For this reason the accuracy of the bias voltage $V_{ls1}$ must be relatively high.

Figure 3:
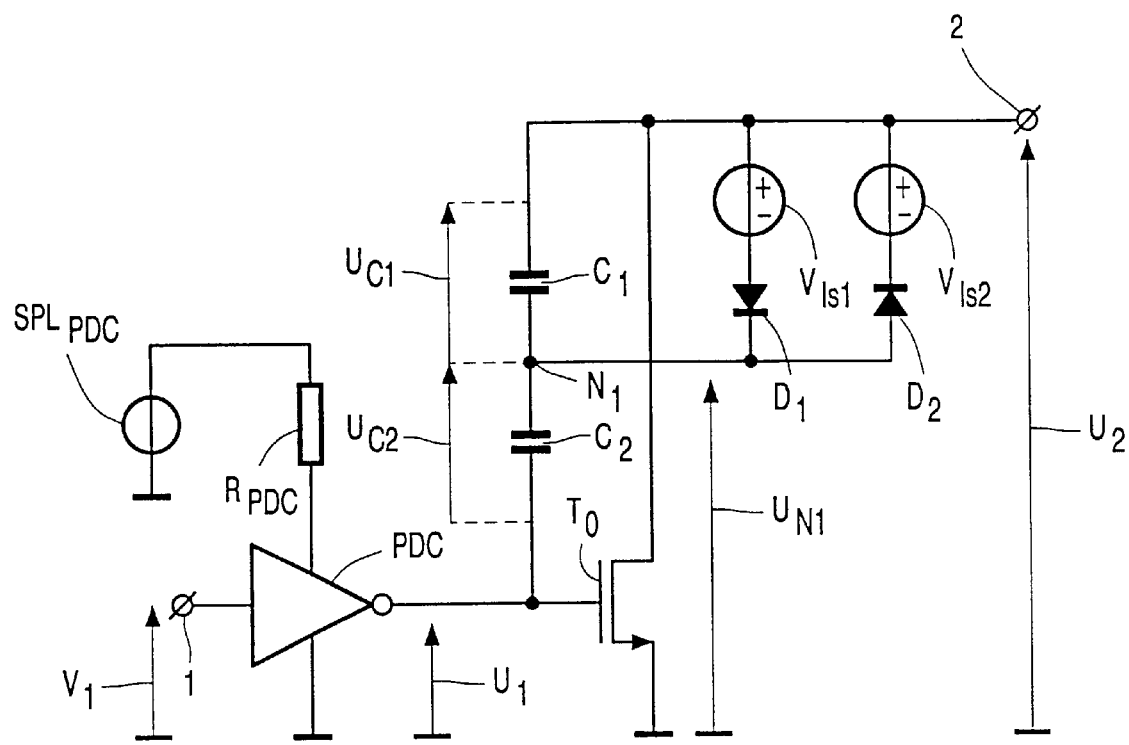
FIG. 3 is a circuit diagram of a second embodiment of a level converter according to the invention.

FIG. 3 shows a circuit diagram of a second embodiment of a level converter according to the invention. A difference of the embodiment of FIG. 3 compared to FIG. 2 is that the bias resistor RB is replaced by a first diode $D_1$. Another difference is that a series arrangement of a second voltage source $V_{ls2}$ and a second diode $D_2$ is arranged in parallel of the series arrangement of the first voltage source $V_{ls1}$ (formerly denoted as voltage source $V_{ls1}$) and the first diode $D_1$. Yet another difference is that the first bias voltage $V_{ls1}$ is yet not signal dependent by has a constant DC-value. The second bias voltage $V_{ls2}$ is also not signal dependent but has a constant DC-value which is normally different from the constant DC-value of the first bias voltage $V_{ls1}$. The first and second diodes $D_1$ and $D_2$ are in fact switches which automatically select either the first voltage source $V_{ls1}$ to be coupled to the internal node $N_1$ or the second voltage source $V_{ls2}$ to be coupled to the internal node $N_1$. By so doing the function of a single but signal dependent voltage source $V_{ls1}$, (see FIG. 5, diagram VII) is more easily implemented by the first voltage source $V_{ls2}$, the second voltage source $V_{ls2}$, the first diode $D_1$ and the second diode $D_2$. Further more by the application of the first and the second diodes $D_1$ and $D_2$ a certain voltage range around the desired voltage of the internal node $N_1$ is created. As a consequence no charging or discharging of the first and the second capacitors occurs as long as the voltage at the internal node $N_1$ is within said voltage range. This has the advantage that the dynamic power dissipation of the level converter is reduced even in the case that the separate bias voltages $V_{ls1}$, and $V_{ls2}$ delivered respectively by the first and second voltage sources $V_{ls1}$ and $V_{ls2}$ are not so very accurate. If by way of example it is assumed that the capacitances of the first and the second capacitors $C_1$ and $C_2$ are equal, the level of the first digital signal $U_1$ equals 2.5 Volt, the level of the second digital signal $U_2$ equals 2.5Volt, and that the threshold voltage of the first and second diodes are 0.5 Volt, then appropriate constant DC-values for $V_{ls1}$ and $V_{ls2}$ are respectively +1.75 Volt and −1.0 Volt.

Figure 4:
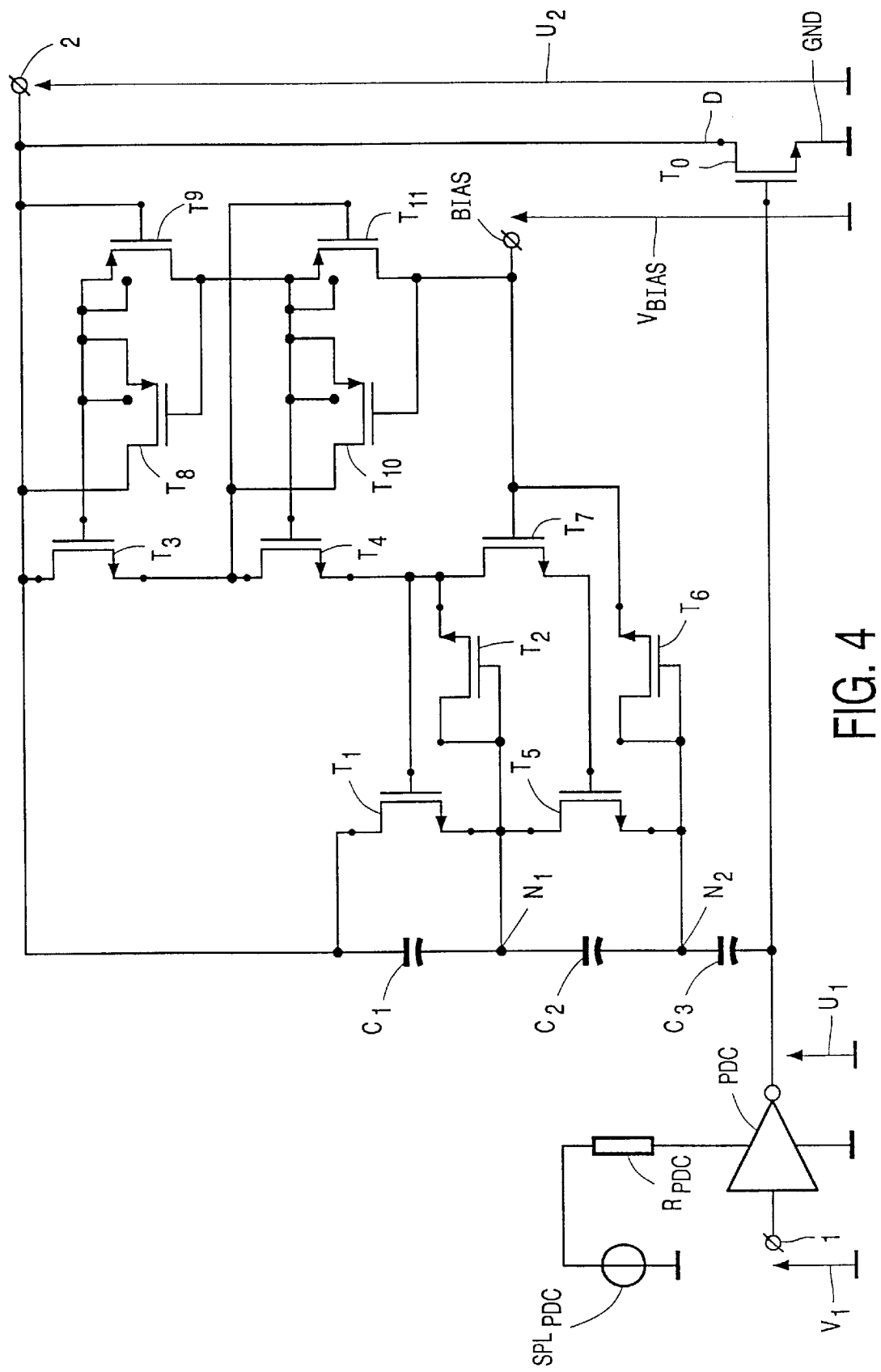
FIG. 4 is a circuit diagram of a third embodiment of a level converter according to the invention.

FIG. 4 shows a circuit diagram of a third embodiment of a level converter according to the invention.

A difference compared to the second embodiment is that the series arrangement for controlling the slew-rate of the second digital signal $U_2$ comprises a first capacitor $C_1$, a second capacitor $C_2$, and a third capacitor $C_3$. As a consequence the said series arrangement comprises two internal nodes: a first internal node $N_1$ and a second internal node $N_2$.

The voltage controlling means comprises first until seventh N-type field effect transistors $T_1$–$T_7$ and eighth until eleventh P-type field effect transistors $T_8$–$T_{11}$. The first field effect transistor $T_1$ comprises a source connected to the common node $N_1$ of the first capacitor $C_1$ and the second capacitor $C_2$, a drain connected to the drain D of the transistor $T_0$, and a gate. The second field effect transistor $T_2$ comprises a source connected to the gate of the first field effect transistor $T_1$, and a drain and a gate which are both connected to the source of the first field effect transistor $T_1$. The third field effect transistor $T_3$ comprises a source, a drain connected to the drain D of the transistor $T_0$, and a gate. The fourth field effect transistor $T_4$ comprises a source connected to the gate of the first field effect transistor $T_1$, a drain connected tot the source of the third field effect transistor $T_3$, and a gate. The fifth field effect transistor $T_5$ comprises a source connected to the common node $N_2$ of the second capacitor $C_2$ and the third capacitor $C_3$, a drain connected to the source of the first field effect transistor $T_1$, and a gate. The sixth field effect transistor $T_6$ comprises a source connected to a bias reference terminal BIAS for receiving a bias voltage $V_{BIAS}$, and a drain and a gate which are both connected to the source of the fifth transistor $T_5$. The seventh field effect transistor $T_7$ comprises a source connected to the gate of the fifth field effect transistor $T_5$, a drain connected to the source of the fourth field effect transistor $T_4$, and a gate connected to the bias reference terminal BIAS. The eighth field effect transistor $T_8$ comprises a source connected to the gate of the third field effect transistor $T_3$, a drain connected to the drain of the transistor $T_0$, and a gate. The ninth field effect transistor $T_9$ comprises a source connected to the gate of the third field effect transistor $T_3$, a drain connected to the gate of the eight field effect transistor $T_8$, and a gate connected to the drain of the transistor $T_0$. The tenth field effect transistor $T_{10}$ comprises a source connected to the gate of the fourth field effect transistor $T_4$ and to the gate of the eight field effect transistor $T_8$, a drain connected to the drain of the fourth field effect transistor $T_4$, and a gate connected to the gate of the seventh field effect transistor $T_7$. The eleventh field effect transistor $T_{11}$ comprises a source connected to the gate of the fourth field effect transistor $T_4$, a drain connected to the gate of the tenth field effect transistor $T_{10}$, and a gate connected to the drain of the tenth field effect transistor $T_{10}$.

It is to be stated that the first and the fifth field effect transistors $T_1$, $T_5$ each have a similar function as the first diode $D_1$ of the second embodiment, and that the second and the sixth field effect transistors $T_2$, $T_6$ each have a similar function as the second diode $D_2$ of the second embodiment. The other field effect transistors (except for $T_0$) are in fact an implementation for the voltages source $V_{ls1}$, $V_{ls2}$, etceteras.

What is claimed is:

1. A level converter for the converting of a first digital signal ($U_1$) having a first voltage range into a second digital signal ($U_2$) having a second voltage range comprising an amplifier ($T_0$) having an input for receiving the first digital signal ($U_1$) and an output for supplying the second digital signal ($U_2$), a series arrangement for controlling the slew-rate of the second digital signal ($U_2$) which comprises at least a first capacitor ($C_1$) and a second capacitor ($C_2$) and which is coupled between the output and the input of the amplifier ($T_0$), and voltage controlling means for controlling the voltages ($V_{C1}$, $V_{C2}$) across the at least first and second capacitors ($C_1$, $C_2$), characterized in that the voltage controlling means comprises at least one voltage source ($V_{ls1}$, $V_{ls2}$) for supplying a separate bias voltage to each internal node ($N_1$, $N_2$) of the series arrangement, and in that the value of the separate bias voltage or the values of the separate bias voltages is/are dependent on the values of the first ($U_1$) and the second ($U_2$) digital signals.

2. A level converter as claimed in claim 1, characterized in that a bias resistor (RB) is arranged in series with at least one of the at least one voltages sources ($V_{ls1}$, $V_{ls2}$).

3. A level converter as claimed in claim 1, characterized in that switching means is/are arranged in series with the at least one voltages sources ($V_{ls1}$, $V_{ls2}$).

4. A level converter as claimed in claim 3, characterized in that the switching means ($D_1$, $D_2$) is formed by diodes ($D_1$, $D_2$).

5. A level converter for the converting of a first digital signal ($U_1$) having a first voltage range into a second digital signal ($U_2$) having a second voltage range comprising a transistor ($T_0$) having a control terminal (G), a first main terminal (S), and a second main terminal (D), whereby the control terminal (G) and the first main terminal (S) form together an input for receiving the first digital signal ($U_1$), and whereby the second main terminal (D) and the first main terminal (S) together form an output for supplying the second digital signal ($U_2$), a series arrangement for controlling the slew-rate of the second digital signal ($U_2$) which comprises a first capacitor ($C_1$) and a second capacitor ($C_2$) and which is coupled between the second main terminal (D) and the control terminal (G) of the transistor ($T_0$), and voltage controlling means for controlling the voltages ($V_{C1}$, $V_{C2}$) across the first and second capacitors ($C_1$, $C_2$), characterized in that the voltage controlling means comprises a first voltage source ($V_{ls1}$), a first diode ($D_1$) arranged in series with the first voltage source ($V_{ls1}$), a second voltage source ($V_{ls2}$), and a second diode ($D_2$) arranged in series with the second voltage source ($V_{ls2}$), and in that the series arrangement of the first voltage source ($V_{ls1}$) with the first diode ($D_1$) is arranged in parallel with the first capacitor ($C_1$), and in that the series arrangement of the second voltage source ($V_{Is2}$) with the second diode ($D_2$) is arranged in parallel with the first capacitor ($C_1$).

6. A level converter for the converting of a first digital signal ($U_1$) having a first voltage range into a second digital signal ($U_2$) having a second voltage range comprising a transistor ($T_0$) having a control terminal (G), a first main terminal (S) coupled to a supply reference terminal (GND), and a second main terminal (D), whereby the control terminal (G) and the supply reference terminal (GND) form together an input for receiving the first digital signal ($U_1$), and whereby the second main terminal (D) and the supply reference terminal (GND) together form an output for supplying the second digital signal ($U_2$), a series arrangement for controlling the slew-rate of the second digital signal ($U_2$) which comprises a first capacitor ($C_1$), a second capacitor ($C_2$), and a third capacitor ($C_3$), and which is coupled between the second main terminal (D) and the control terminal (G) of the transistor ($T_0$), and voltage controlling means for controlling the voltages ($V_{C1}$, $V_{C2}$, $V_{C3}$) across the first, the second and the third capacitors ($C_1$, $C_2$, $C_3$), characterized in that the voltage controlling means comprises first until seventh field effect transistors ($T_1$–$T_7$) of a first conduction type and eighth until eleventh field effect transistors ($T_8$–$T_{11}$) of a second conduction type, and in that the first field effect transistor ($T_1$) comprises a first main terminal coupled to a common node ($N_1$) of the first capacitor ($C_1$) and the second capacitor ($C_2$), a second main terminal coupled to the second main terminal (D) of the transistor ($T_0$), and a gate, and in that the second field effect transistor ($T_2$) comprises a first main terminal coupled to the gate of the first field effect transistor ($T_1$), and a second main terminal and a gate which are both coupled to the first main terminal of the first field effect transistor ($T_1$), and in that the third field effect transistor ($T_3$) comprises a first main terminal, a second main terminal coupled to the second main terminal (D) of the transistor ($T_0$), and a gate, and in that the fourth field effect transistor ($T_4$) comprises a first main terminal coupled to the gate of the first field effect transistor ($T_1$), a second main terminal coupled tot the first main terminal of the third field effect transistor ($T_3$), and a gate, and in that the fifth field effect transistor ($T_5$) comprises a first main terminal coupled to a common node ($N_2$) of the second capacitor ($C_2$) and the third capacitor ($C_3$), a second main terminal coupled to the first main terminal of the first field effect transistor ($T_1$), and a gate, and in that the sixth field effect transistor ($T_6$) comprises a first main terminal coupled to a bias reference terminal (BIAS) for receiving a bias voltage ($V_{BIAS}$), and a second main terminal and a gate which are both coupled to the first main terminal of the fifth transistor ($T_5$), and in that the seventh field effect transistor ($T_7$) comprises a first main terminal coupled to the gate of the fifth field effect transistor ($T_5$), a second main terminal coupled to the first main terminal of the fourth field effect transistor ($T_4$), and a gate coupled to the bias reference terminal (BIAS), and in that the eighth field effect transistor ($T_8$) comprises a first main terminal coupled to the gate of the third field effect transistor ($T_3$), a second main terminal coupled to the second main terminal of the transistor ($T_0$), and a gate, and in that the ninth field effect transistor ($T_9$) comprises a first main terminal coupled to the gate of the third field effect transistor ($T_3$), a second main terminal coupled to the gate of the eight field effect transistor ($T_8$), and a gate coupled to the second main terminal of the transistor ($T_0$), and in that the tenth field effect transistor ($T_{10}$) comprises a first main terminal coupled to the gate of the fourth field effect transistor ($T_4$) and to the gate of the eight field effect transistor ($T_8$), a second main terminal coupled to the second main terminal of the fourth field effect transistor ($T_4$), and a gate coupled to the gate of the seventh field effect transistor ($T_7$), and in that the eleventh field effect transistor ($T_{11}$) comprises a first main terminal coupled to the gate of the fourth field effect transistor ($T_4$), a second main terminal coupled to the gate of the tenth field effect transistor ($T_{10}$), and a gate coupled to the second main terminal of the tenth field effect transistor ($T_{10}$).

* * * * *